(12) United States Patent
Andre et al.

(10) Patent No.: US 6,522,276 B2
(45) Date of Patent: Feb. 18, 2003

(54) SYSTEM OF DAC CORRECTION FOR A ΔΣ MODULATOR

(75) Inventors: Eric Andre, Seyssins (FR); Frédéric Paillardet, Aix-les-Bains (FR)

(73) Assignee: STMicroelectronics S.A., Gentilly-Cedex (FR)

( * ) Notice: Subject to any disclaimer, the term of this patent is extended or adjusted under 35 U.S.C. 154(b) by 0 days.

(21) Appl. No.: 09/794,409

(22) Filed: Jun. 20, 2001

(65) Prior Publication Data

US 2001/0038350 A1 Nov. 8, 2001

(30) Foreign Application Priority Data

Mar. 1, 2000 (FR) .............................. 00 02611

(51) Int. Cl.⁷ ................................ H03M 3/00
(52) U.S. Cl. ......................... 341/143; 341/144; 341/155
(58) Field of Search ................. 341/143, 120, 341/118, 131, 144, 155

(56) References Cited

U.S. PATENT DOCUMENTS

| 4,999,627 | A | * | 3/1991 | Agazzi ........................ 341/131 |
| 5,248,970 | A | * | 9/1993 | Sooch et al. ................. 341/120 |
| 5,781,138 | A | * | 7/1998 | Knudsen ..................... 341/143 |
| 6,127,955 | A | * | 10/2000 | Handel et al. ............... 341/120 |

FOREIGN PATENT DOCUMENTS

EP 0 964 524 12/1999

OTHER PUBLICATIONS

Groeneveld et al., "A Self–Calibration Technique for Monolithic High–Resolution D/A Converters", Journal of Solid–State Circuits, vol. 24, No. 6, pp. 1517–1522, 1989 (No month).

Sarhang–Nejad et al., "A High–Resolution Multibit ΣΔ ADC with Digital Correction and Relaxed Amplifier Requirements", (no month) Journal of Solid–State Circuits, vol. 28, No. 6, pp. 648–660 1993.

Cataltepe et al., "Digitally Corrected Multi–Bit ΣΔ Data Converters", ISCAS'89, pp. 647–650, 1989 (no month).

Baird et al., "A Low Oversampling Ration 14–b 500–kHz ΔΣ ADC with a Self–Calibrated Multibit DAC", IEEE Journal of Solid–State Circuits, vol. 31, No. 3, 1996 (no month).

* cited by examiner

Primary Examiner—Peguy JeanPierre
Assistant Examiner—Jean Bruner Jeanglaude
(74) Attorney, Agent, or Firm—Jacobson Holman PLLC

(57) ABSTRACT

A ΔΣ modulator including a corrector unit for measuring an error due to differences in the operating parameters of individual components of an internal D/A converter, the corrector unit applying a correction of the error measured in this way to a digital signal, the modulator being characterized in that the internal D/A converter includes a number of individual components greater than the number necessary for internal conversion, and in that the corrector unit is suitable for extracting from the internal conversion process, in alternation, on each occasion a different component from the various individual components in order to measure the operating parameter error of the extracted component, while leaving a number of components in action that is sufficient for internal conversion.

15 Claims, 2 Drawing Sheets

A/D MODULATOR

DAC input — C — DAC output to 1-bit ΔΣ modulator

SYSTEM OF DAC CORRECTION FOR A ΔΣ MODULATOR

BACKGROUND OF THE INVENTION

1. Field of the Invention

The present invention relates to ΔΣ modulation, and more particularly to taking account of and correcting the imperfections of an internal digital to analog converter in the ΔΣ modulator.

2. Description of the Related Art

ΔΣ modulators perform analog to digital (A/D) or digital to analog (D/A) conversion at high bit resolution by means of low resolution internal A/D converters (ADCs) or D/A converters (DACs), typically converters having resolution of 1 to 4 bits.

This is made possible in particular by oversampling the analogue signal and by shaping quantization noise.

In general, ΔΣ modulators comprise a DAC which is generally a 1-bit DAC, e.g. in a negative feedback branch.

Such a 1-bit DAC has only two output levels (+Vref and −Vref) and they are capable of being interconnected by a straight line (the DAC is intrinsically linear).

Each time it compares the signal on its input with a reference voltage Vref, this quantizing DAC associates the input level with a voltage +Vref or a voltage −Vref.

Proposals have been made to replace the 1-bit DAC with a multibit DAC, but the performance of multibit ΔΣ modulators turns out to be limited by a lack of precision in the internal DAC.

Beyond one bit, the disparity between output levels will give rise to non linearity in the DAC, i.e. to non-proportionality between the input and the output of the DAC, thus limiting the performance of the DAC. This disparity is due to inaccuracy concerning the individual components used, e.g. concerning the capacitances of the various capacitors if the ΔΣ modulator has switched capacitors integrated on silicon.

For example, if it is desired to obtain a 16-bit A/D converter using a multibit ΔΣ modulator, that means the linearity of its internal DAC must be at least 16 bits.

Achieving acceptable performance for a multibit DAC requires implementation techniques that are complex and expensive (laser adjustment, component matching), thus destroying the advantage of ΔΣ modulation which was initially supposed to obtain high-performance using components that are of little complexity, thus enabling them to be integrated very easily on silicon.

Systems and algorithms have been proposed for correcting the imperfections of D/A converter components, as have systems for enabling such components to be calibrated automatically. Nevertheless, the only systems they have made possible are limited in operating speed and in resolution.

Thus, in an article by Groeneveld, et al., entitled "A Self-Calibration Technique for Monolithic High-Resolution D/A Converters", Journal of Solid-State Circuits, vol. 24, No. 6, pp. 1517–1522 (1989), a D/A converter is proposed having a plurality of current sources, each supplying either a constant current at a value that is accurately fixed, or else no current, with the value of the digital input determining the number of sources that are activated.

That document proposes using one source additional to the number of sources necessary for conversion.

Thus, each of the sources is successively taken out of the conversion process in order to be calibrated on a preset current value. The number of sources in activity is thus always sufficient, and there is also one source that is being calibrated.

The method described in that document suffers from the drawback of having calibration time that depends on the technology used. By using individual components restricted to current sources, power consumption and surface area requirements for integration on silicon remain relatively large.

For a D/A converter internal to the ΔΣ modulator, an article by Sarhand-Nejad et al., entitled "A High-Resolution Multibit ΔΣ ADC with Digital Correction and Relaxed Amplifier Requirements", Journal of Solid-State Circuits, vol. 28, No. 6, pp 648–660 (1993), proposes a method of correcting conversion parameter errors that consists in applying correction vectors in the digital domain.

In that method, faults associated with inaccuracies concerning the elements of the D/A converter are measured during a calibration stage that requires the converter to be stopped.

The errors are measured for each of the capacitor charge state combinations, i.e. for 16 possible combinations. Thereafter, the error vector as determined in this way is applied in the digital domain.

Because it requires conversion to be stopped in order to determine the error vector, that method is difficult to adapt to converters that are required to operate continuously. Because it does not provide continuous adaptation of the error vector, it is particularly sensitive to the changes in parameter values that occur while conversion is taking place, where such changes are of a kind that is to be encountered in converters of that type.

The invention seeks to propose a multibit D/A or A/D ΔΣ modulator suitable for taking account of errors in the operating parameters of the individual components of the internal D/A converter while it is in the process of performing conversion, and for correcting such errors automatically.

According to the invention, this object is achieved by a ΔΣ modulator including means for measuring an error due to differences in the operating parameters of individual components of its internal D/A converter, and means for applying a correction of the error measured in this way to a digital signal, the modulator being characterized in that the internal converter comprises a number of individual components greater than the number necessary for internal conversion, and in that the measurement means are suitable for extracting in alternation from the internal conversion process, on each occasion a different component from the various individual components in order to measure the operating parameter error of the extracted component, while leaving a number of components in action that is sufficient for internal conversion.

BRIEF DESCRIPTION OF THE DRAWINGS

Other characteristics, objects, and advantages of invention will appear on reading the following detailed description given with reference to the accompanying drawings, in which.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 5:
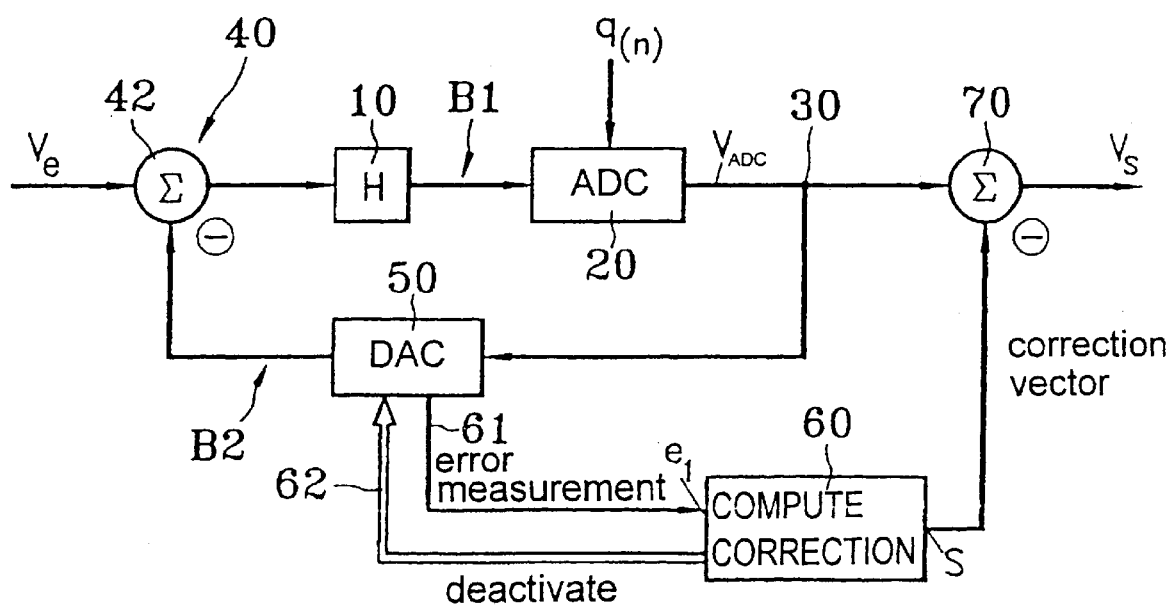
FIG. 5 shows an A/D ΔΣ modulator of the invention.

The ΔΣ modulator shown in FIG. 5 comprises:

a main branch B1 containing in conventional manner an analogue filter 10 followed by an A/D converter 20; and a negative feedback branch B2 containing a DAC 50. The negative feedback branch B2 connects the output 30 of the main branch B1 to the input 40 of the same main branch, where the two branches B1 and B2 meet via a summing circuit 42.

In this case, the DAC 50 is a multibit DAC having switched capacitors integrated on silicon.

SUMMARY OF THE INVENTION

The modulator also has a corrector unit 60 connected to the DAC 50 via a link 61 to take therefrom measurements of parameter differences for each of the quantization elements in the DAC 50.

The corrector unit 60 also has a control link represented by double-line arrow 62 via which it controls switching of the various capacitors of the DAC 50 in order to extract each of them individually from the conversion process.

Figure 4:
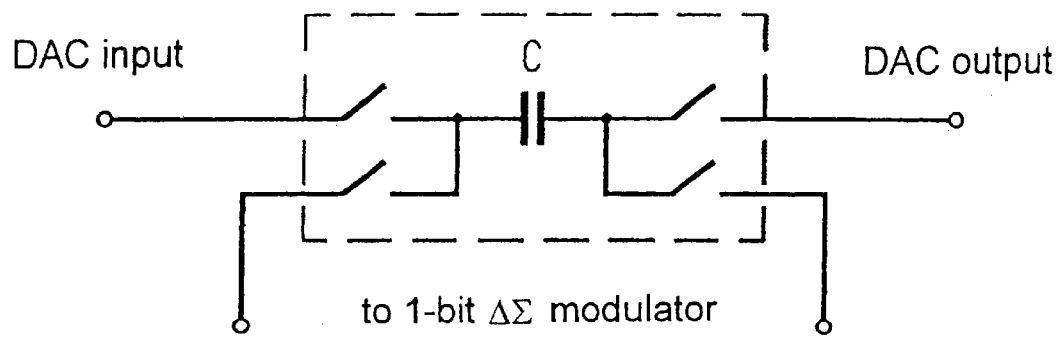
FIG. 4 shows an individual capacitance connected for D/A conversion in accordance with the invention.

To do this, the capacitors of the DAC 50 are connected as shown in FIG. 4, each being connected between a pair of switches, each pair being suitable for connecting the capacitor either to the remainder of the DAC, or else to the measurement link 61 via which the unit 60 then measures its capacitance.

The internal converter is preferably made up of individual elements, i.e., quantization elements all having the same value. For example, a DAC having 9 output levels can be made up of N=8 individual capacitors so as to form codes 0, 1, . . . , 8.

The internal converter is preferably made up of individual elements, i.e. quantization elements all having the same value. For example, a DAC having 9 output levels can be made up of N=8 individual capacitors so as to form codes 0, 1, . . . , 8, as shown in FIGS. 7 and 8.

During conversion, one of the capacitors is always extracted from the conversion process.

On the basis of the measured capacitance, the unit 60 deduces whether the capacitance of this capacitor is drifting from the expected value, and it updates an error vector on the basis of which it generates a correction vector for application to the ΔΣ modulator in the digital domain.

Correction and is then performed by re-injecting the correction vector into the output of the A/D ΔΣ modulator.

In order to perform the capacitance-measuring operations without disturbing the operation of the ΔΣ modulator, the DAC 50 has an additional individual element (a capacitor) so that each extracted element can be replaced by the element that was previously extracted.

Thus, since the present DAC has 9 output levels, it ought in the usual way to have only 8 capacitors, however in this case it has 8+1=9 individual capacitors.

As mentioned above, an individual capacitor is replaced by another by suitably controlling the switches that switch the capacitors, under the control of the unit 60.

Overall, the operation of the ΔΣ modulator is not disturbed because a supernumerary individual element is used that is additional compared to the number of elements N that is required for conversion purposes.

One of the N+1 individual elements can take the place of the element that is being calibrated so that the DAC always sees the necessary N individual elements.

Thus, for each extracted capacitor, the unit 60 measures its capacitance, and on the basis of the difference between the measured capacitance and an expected ideal value, it computes the correction to be applied to the digital signal output by the A/D ΔΣ modulator.

More precisely, on the basis of each new measured capacitance, the unit 60 determines a series of updated error values in the form of a vector, and the summing circuit 70 adds a combination of these various values of the error vector to the output values $V_{ADC}$ of the ΔΣ modulator.

For this purpose, the summing circuit 70 is adapted to add together the output data $V_{ADC}$ and a correction value which corresponds specifically to the amplitude of the instantaneous output value $V_{ADC}$ from the ADC 30.

The unit 60 thus performs simultaneously a function of controlling the extraction of one of the capacitors from the DAC 50, a function of measuring the capacitance of said capacitor, and a function of computing an updated correction vector for transmission to the summing circuit 70.

Figure 1:
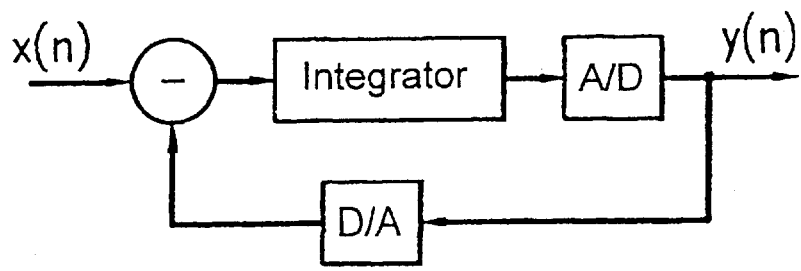
FIG. 1 shows a circuit comprising a prior art A/D modulator.
Figure 2:
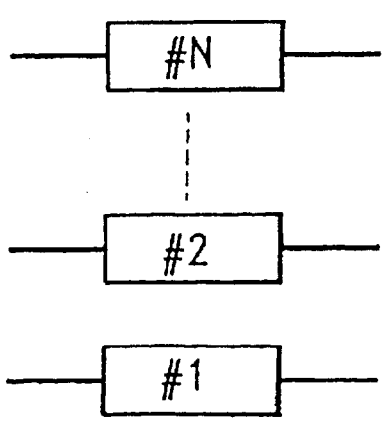
FIG. 2 is a diagram showing a series of quantization components connected in parallel.
Figure 3:
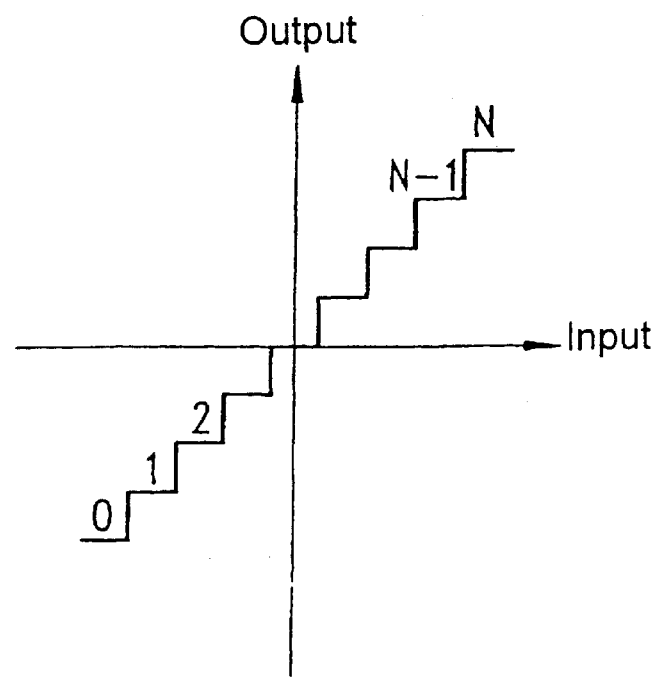
FIG. 3 shows a characteristic of an internal D/A converter having N+1 output levels.

In a preferred embodiment of invention, in order to measure the extracted capacitance, the unit 60 itself comprises a first order A/D 1-bit ΔΣ modulator whose general structure (not shown in FIG. 5) is as shown in FIG. 1.

The proposed system extracts the exact capacitance of each individual element (capacitor) by including it in a first order 1-bit ΔΣ modulator.

The individual capacitance being measured thus acts as the sampling capacitor for the first order 1-bit ΔΣ modulator, with said first order 1-bit ΔΣ modulator being subjected to an input signal which is equal to the reference voltage of said first order 1-bit ΔΣ modulator.

This additional modulator is preferably followed by an averaging circuit made up of two n-bit counters as described in document [2], serving to compute an average of the various output values from the additional modulator.

Depending on the measured capacitance, the output from the 1-bit ADC provides some number of plus values that is greater or less than the number of minus values it provides, with the difference being proportional to the actual value of the capacitance.

The averaging circuit thus delivers a value which is proportional to the difference between the frequency at which plus values appear and the frequency at which minus values appear, i.e. proportional to the actual capacitance.

The value delivered by the averaging circuit is a digital value, such that the unit 60 also performs an A/D conversion function making possible to write the capacitance of each capacitor in a memory of the unit 60.

Using a first order 1-bit ΔΣ modulator to digitize the exact capacitance of the individual capacitor makes it possible to achieve high resolution (16 bits) at reduced complexity.

In order to obtain 16 bit accuracy when measuring an individual element, it is necessary to have at least $2^{16}$ (=65536) samples.

With a first order $\Delta\Sigma$ modulator operating at 40 MHz, that means that each individual element is calibrated in 1.64 ms.

The time required to self-calibrate the internal DAC is thus sufficiently short for the proposed system to be considered as being a robust in the face of external disturbances (temperature variations, aging, . . . ).

In other words, the system updates the correction it performs at a speed which is higher than the speed at which the capacitances of its capacitors vary.

Calibration time is sufficiently short (a few milliseconds) for it to be considered that variations in the values of the individual elements (due temperature differences, component aging, . . . ) do not have enough time to produce significant effects between two measurements and the corresponding updates.

The extra complexity due to the self-calibration is caused to be very small by using a first order 1-bit $\Delta\Sigma$ modulator.

By using the first order 1-bit $\Delta\Sigma$ modulator to measure the exact capacitance of an individual element, the modulator can give rise to unwanted conversion gain. Nevertheless, this gain is identical for each of the measured individual elements, so it has little influence on the performance of the proposed system.

It has thus been found that variation of 3% degrades the signal to noise ratio by about 1 dB compared with the ideal case.

The invention also applies to $\Delta\Sigma$ modulators for D/A conversion.

In that case likewise, such a $\Delta\Sigma$ modulator includes an internal D/A converter and its individual elements (e.g. capacitors or resistors) present undesired variations in their parameters.

Such an internal DAC is typically placed on a main branch, at the output from the $\Delta\Sigma$ modulator.

In a preferred embodiment of invention, the DAC is provided with an additional individual element, and a unit is provided that is similar to the above-described unit 60 in order to extract each of the individual components one by one from the DAC, measure the parameter of the extracted component, and use the measurement to compute an updated error vector.

The error vector is then subtracted from the digital values reaching the input of the D/A $\Delta\Sigma$ modulator.

It is thus preferable to place the corrector unit in a negative feedback loop of the D/A $\Delta\Sigma$ modulator.

A The corrector unit preferably includes a first order 1-bit modulator, and it also uses the individual element that has been extracted as the sampling capacitor for the first order 1-bit modulator.

The system makes it possible to implement high-resolution multi-bit $\Delta\Sigma$ converters (both A/D and D/A) that are integrated on silicon, and one application therefor lies in mobile telephone terminals.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

What is claimed is:

1. A $\Delta\Sigma$ modulator comprising means for measuring an error due to differences in the operating parameters of individual components of an internal D/A converter, and means for applying a correction of the error measured to a digital signal (Vs), the internal D/A converter including a number of individual components greater than a number necessary for an internal conversion process, the measurement means for extracting from the internal conversion process in alternation, on each occasion a different component from said individual components in order to measure an operating parameter error of the extracted component, while leaving a number of components in action that is sufficient for continuing said internal conversion process.

2. The $\Delta\Sigma$ modulator according to claim 1, wherein the measurement means includes an additional A/D $\Delta\Sigma$ converter and switching control means suitable for incorporating the extracted component in the additional $\Delta\Sigma$ converter as a sampling capacitor of the $\Delta\Sigma$ modulator of said additional $\Delta\Sigma$ converter.

3. The $\Delta\Sigma$ modulator according to claim 2, wherein the additional As converter is a first order 1-bit $\Delta\Sigma$ converter.

4. The $\Delta\Sigma$ modulator according to claim 2, wherein the additional $\Delta\Sigma$ converter is an A/D $\Delta\Sigma$ modulator followed by a decimator.

5. The $\Delta\Sigma$ modulator according to claim 1, wherein the internal D/A converter whose individual component values are measured is a switched capacitor converter.

6. The $\Delta\Sigma$ modulator according to claim 1, wherein the internal converter whose quantizing component values are measured is integrated on silicon.

7. A $\Delta\Sigma$ modulator comprising:

an internal D/A converter for performing an internal conversion process, said D/A converter including a plurality of individual components, a number of said individual components being greater than a number necessary for said internal conversion process;

a corrector unit for measuring an error due to differences in operating parameters of said plurality of individual components of said internal D/A converter by extracting, on an alternating basis, a different one of said plurality of individual components on each occasion in order to measure an operating parameter error of the extracted component, while leaving a sufficient number of components in action to allow the internal conversion process to continue simultaneously, said corrector unit applying a correction of the error measured to a digital signal (Vs).

8. The $\Delta\Sigma$ modulator according to claim 7, wherein the corrector unit comprises an additional A/D $\Delta\Sigma$ converter and switching control mechanism suitable for incorporating the extracted component in the additional $\Delta\Sigma$ converter as a sampling capacitor of the $\Delta\Sigma$ modulator of said additional $\Delta\Sigma$ converter.

9. The $\Delta\Sigma$ modulator according to claim 8, wherein the additional $\Delta\Sigma$ converter is a first order 1-bit $\Delta\Sigma$ converter.

10. The $\Delta\Sigma$ modulator according to claim 8, wherein the additional $\Delta\Sigma$ converter is an A/D $\Delta\Sigma$ modulator followed by a decimator.

11. The $\Delta\Sigma$ modulator according to claim 7, wherein the internal D/A converter is a switched capacitor converter.

12. The $\Delta\Sigma$ modulator according to claim 7, wherein the internal D/A converter is integrated on silicon.

13. The $\Delta\Sigma$ modulator according to claim 7, wherein said corrector unit includes a control link for switching a respective one of said individual components to a measurement link to measure said operating parameter error.

14. A method of performing an internal conversion process using a $\Delta\Sigma$ modulator having an internal D/A converter, and of simultaneously correcting an output thereof, comprising the steps of:

performing an internal conversion process using said D/A converter, said D/A converter having a number of capacitors greater than a minimum number necessary for said internal conversion process;

extracting, simultaneously with said step of performing, one of said capacitors by a corrector unit, said extracted capacitor not participating in said internal conversion process but switched to a measurement link of said corrector unit while said internal conversion process continues to be performed in said D/A converter using said minimum number of capacitors;

measuring a capacitance of said extracted capacitor to determine whether said capacitance is drifting from an expected value;

generating, in response to an error measured in said capacitance, a correction vector; and inputting said correction vector to an output of said modulator.

15. The method as set forth in claim 14, further comprising repeating the steps of extracting, measuring, generating and inputting with a different one of said number of capacitors such that each of said number of capacitors is alternatingly extracted while said minimum number of capacitors continues to perform said internal conversion process.

* * * * *